United States Patent
Mieney et al.

(10) Patent No.: US 11,320,737 B1
(45) Date of Patent: May 3, 2022

(54) FOUNTAIN SOLUTION THICKNESS MEASUREMENT USING A HOT WIRE ANEMOMETER IN A LITHOGRAPHY PRINTING SYSTEM

(71) Applicant: Xerox Corporation, Norwalk, CT (US)

(72) Inventors: Christopher Mieney, Rochester, NY (US); David A. Vankouwenberg, Avon, NY (US); Martin L. Frachioni, Rochester, NY (US); David M. Gurak, Webster, NY (US); Stuart A. Schweid, Pittsford, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 17/137,711

(22) Filed: Dec. 30, 2020

(51) Int. Cl.
*G03F 7/20* (2006.01)
*G01P 5/10* (2006.01)
*G01B 13/06* (2006.01)

(52) U.S. Cl.
CPC .............. *G03F 7/20* (2013.01); *G01B 13/06* (2013.01); *G01P 5/10* (2013.01)

(58) Field of Classification Search
CPC .............. G03F 7/20; G01B 13/06; G01P 5/10
USPC .................................................. 35/18; 355/18
See application file for complete search history.

(56) References Cited

U.S. PATENT DOCUMENTS

| 2013/0247787 A1* | 9/2013 | Liu ..................... B41F 33/0054 101/147 |
| 2013/0247788 A1* | 9/2013 | Liu ..................... B41F 7/30 101/147 |
| 2020/0278129 A1* | 9/2020 | Schmidlin ................. F24F 11/89 |

OTHER PUBLICATIONS

Co-pending U.S. Appl. No. 17/137,516, filed Dec. 30, 2020.
Co-pending U.S. Appl. No. 17/137,626, filed Dec. 30, 2020.
Co-pending U.S. Appl. No. 17/137,473, filed Dec. 30, 2020.
Co-ending U.S. Appl. No. 16/917,044, filed Jun. 30, 2020.
Co-pending U.S. Appl. No. 16/916,907, filed Jun. 30, 2020.
Co-pending U.S. Appl. No. 16/913,626, filed Jun. 26, 2020.
Co-pending U.S. Appl. No. 16/913,351, filed Jun. 26, 2020.
Co-pending U.S. Appl. No. 16/913,302, filed Jun. 26, 2020.
"Understanding Hot-Wire Anemometry", Qpedia, Advanced Thermal Solutions, Inc., pp. 13-17, 2007.
"Effect of Humidity in Hot-Wire Anemometry", U.S. Department of Commerce, Research Paper RP850, Part of Journal at Research of the National Bureau of Standards, vol. 15, pp. 575-578, Dec. 1935.

* cited by examiner

Primary Examiner — Hung Nguyen
(74) Attorney, Agent, or Firm — Caesar Rivise, PC

(57) ABSTRACT

According to aspects of the embodiments, there is provided a method of measuring the amount of fountain solution using a hot wire anemometer. Fountain solution thickness is measured using the flow rate of vaporized fountain solution and comparing to baseline air only flow rate. The vaporized measurement is correlated with the baseline utilizing specific heat, density and enthalpy values and keeping velocity of fluid constant. Changes in the measurement will then be related to the specific heat, density and enthalpy. Density can be back calculated to yield volume and knowing the area of the image being printed give a real time thickness value.

20 Claims, 5 Drawing Sheets

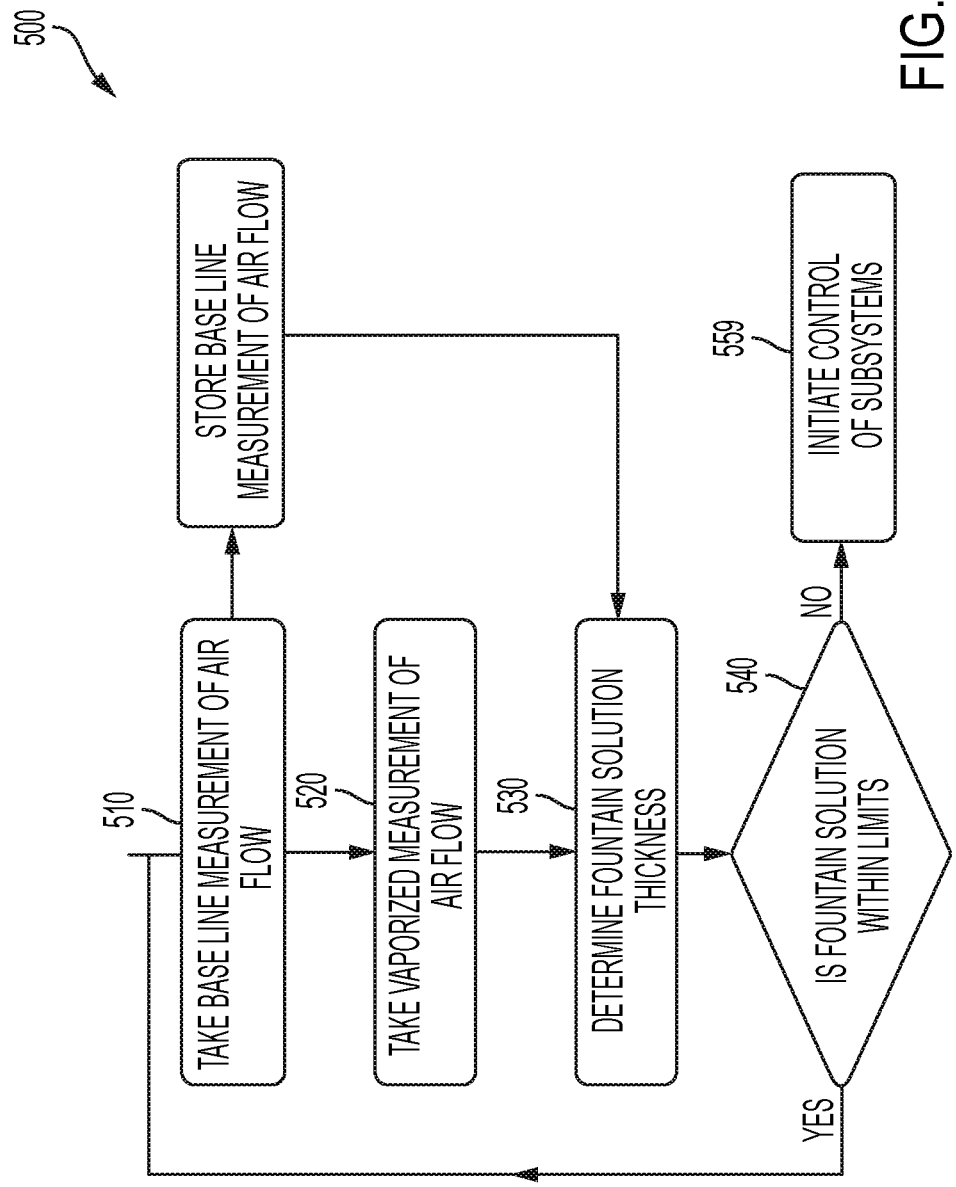

FOUNTAIN SOLUTION THICKNESS MEASUREMENT USING A HOT WIRE ANEMOMETER IN A LITHOGRAPHY PRINTING SYSTEM

FIELD OF DISCLOSURE

This invention relates generally to digital printing systems, and more particularly, to fountain solution deposition systems and methods for use in lithographic offset printing systems.

BACKGROUND

Conventional lithographic printing techniques cannot accommodate true high speed variable data printing processes in which images to be printed change from impression to impression, for example, as enabled by digital printing systems. The lithography process is often relied upon, however, because it provides very high quality printing due to the quality and color gamut of the inks used. Lithographic inks are also less expensive than other inks, toners, and many other types of printing or marking materials.

Ink-based digital printing uses a variable data lithography printing system, or digital offset printing system, or a digital advanced lithography imaging system. A "variable data lithography system" is a system that is configured for lithographic printing using lithographic inks and based on digital image data, which may be variable from one image to the next. "Variable data lithography printing," or "digital ink-based printing," or "digital offset printing," or digital advanced lithography imaging is lithographic printing of variable image data for producing images on a substrate that are changeable with each subsequent rendering of an image on the substrate in an image forming process.

For example, a digital offset printing process may include transferring ink onto a portion of an imaging member (e.g., fluorosilicone-containing imaging member, imaging blanket, printing plate) that has been selectively coated with a fountain solution (e.g., dampening fluid) layer according to variable image data. According to a lithographic technique, referred to as variable data lithography, a non-patterned reimageable surface of the imaging member is initially uniformly coated with the fountain solution layer. An imaging system then evaporates regions of the fountain solution layer in an image area by exposure to a focused radiation source (e.g., a laser light source, high power laser) to form pockets. A temporary pattern latent image in the fountain solution is thereby formed on the surface of the digital offset imaging member. The latent image corresponds to a pattern of the applied fountain solution that is left over after evaporation. Ink applied thereover is retained in the pockets where the laser has vaporized the fountain solution. Conversely, ink is rejected by the plate regions where fountain solution remains. The inked surface is then brought into contact with a substrate at a transfer nip and the ink transfers from the pockets in the fountain solution layer to the substrate. The fountain solution may then be removed, a new uniform layer of fountain solution applied to the printing plate, and the process repeated.

Digital printing is generally understood to refer to systems and methods of variable data lithography, in which images may be varied among consecutively printed images or pages. "Variable data lithography printing," or "ink-based digital printing," or "digital offset printing" are terms generally referring to printing of variable image data for producing images on a plurality of image receiving media substrates, the images being changeable with each subsequent rendering of an image on an image receiving media substrate in an image forming process. "Variable data lithographic printing" includes offset printing of ink images generally using specially-formulated lithographic inks, the images being based on digital image data that may vary from image to image, such as, for example, between cycles of an imaging member having a reimageable surface.

The inventors have found that the amount or thickness of the fountain layer which is present on the printing plate is a critical part of digital offset printing methods in order to maintain sharp and clear images. The layer is extremely thin, on the order of tens of nanometers, which until now any direct measurement of its thickness difficult. Knowledge of the layer thickness is helpful to control the system image quality. For example, if insufficient fountain solution is provided to a non-image area, the ink will invade the non-image area to create a distorted printing image. Conversely, if too much fountain solution is provided so that the fountain solution enters the image area, a distortion of the image will also result.

The amount or thickness of fountain solution which is applied to the printing plates is therefore critical to the production of clear printed images. Currently, the amount of fountain solution which is applied to the plates used in offset lithography is based principally on the experience of the offset press operator. There is to date no accurate method of quantifying the amount of fountain solution used in offset lithography printing processes so as to minimize the undesirable effects of too much or too little fountain solution.

It would therefore be a significant advance in the art of digital offset printing if the amount of fountain solution which is used in the marking process could be quantified without disrupting the operation of the printing process.

SUMMARY

The following presents a simplified summary in order to provide a basic understanding of some aspects of one or more embodiments or examples of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later. Additional goals and advantages will become more evident in the description of the figures, the detailed description of the disclosure, and the claims.

The foregoing and/or other aspects and utilities embodied in the present disclosure may be achieved by determining fountain solution thickness by measuring the flow rate of vaporized fountain solution with a hot wire anemometer and comparing to baseline air only flow rate. The vaporized measurement is correlated with the baseline utilizing specific heat, density and enthalpy values and keeping velocity of fluid constant. Finally, density is back calculated to yield volume and knowing the area of the image being printed give a real time thickness value.

According to aspects illustrated herein, an exemplary method useful in printing with a variable data lithography system, comprising using a dampening station configured to provide fountain solution in an airborne state to a reimageable surface; performing an assessment check, including taking a base line measurement of air flow, and storing said base line measurement in a memory; taking an operational measurement of the air flow with a flow measurement device during application of the fountain solution in an airborne state to the reimageable surface; determining fountain solution thickness at the reimageable surface from a difference between the operational measurement and the base line measurement.

According to aspects described herein, a apparatus useful for printing with an ink-based digital image forming device may include a flow control structure that confines airborne fountain solution provided from a flow conduit to a condensation region to support forming a fountain solution layer at the reimageable surface; an optical patterning subsystem being configured to irradiate the fountain solution layer according to digital image data; a flow measurement device in line with said flow control structure which measures air flow around the reimageable surface; a processor; and a storage device coupled to the processor, wherein the storage device comprises instructions which, when executed by the processor, cause the processor to control optical patterning subsystem based fountain solution layer thickness by: performing an assessment check, including taking a base line measurement of the air flow, and storing said base line measurement in a memory; taking an operational measurement of the air flow with the flow measurement device during application of the fountain solution in an airborne state to the reimageable surface; determining fountain solution thickness at the reimageable surface from a difference between the operational measurement and the base line measurement.

Exemplary embodiments are described herein. It is envisioned, however, that any system that incorporates features of apparatus and systems described herein are encompassed by the scope and spirit of the exemplary embodiments.

BRIEF DESCRIPTION OF THE DRAWINGS

Various exemplary embodiments of the disclosed apparatuses, mechanisms and methods will be described, in detail, with reference to the following drawings, in which like referenced numerals designate similar or identical elements, and:

FIG. 5 is a flowchart depicting the operation of an exemplary method to directly measure fountain solution for use in a digital image forming device.

DETAILED DESCRIPTION

Figure 1:
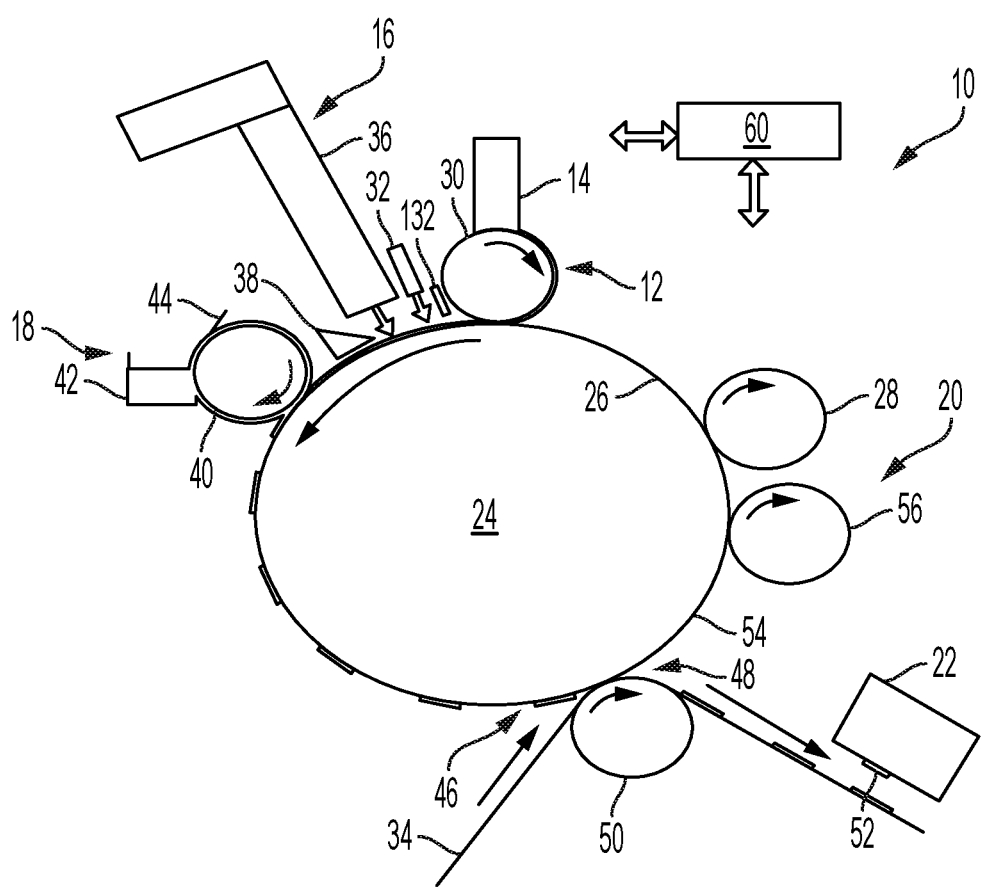
FIG. 1 is block diagram of a digital image forming device in accordance with examples of the embodiments.

Illustrative examples of the devices, systems, and methods disclosed herein are provided below. An embodiment of the devices, systems, and methods may include any one or more, and any combination of, the examples described below. This invention may, however, be embodied in many different forms and should not be construed as limited to the embodiments set forth below. Rather, these exemplary embodiments are provided so that this disclosure will be thorough and complete, and will fully convey the scope of the invention to those skilled in the art. Accordingly, the exemplary embodiments are intended to cover all alternatives, modifications, and equivalents as may be included within the spirit and scope of the apparatuses, mechanisms and methods as described herein.

We initially point out that description of well-known starting materials, processing techniques, components, equipment and other well-known details may merely be summarized or are omitted so as not to unnecessarily obscure the details of the present disclosure. Thus, where details are otherwise well known, we leave it to the application of the present disclosure to suggest or dictate choices relating to those details. The drawings depict various examples related to embodiments of illustrative methods, apparatus, and systems for inking from an inking member to the reimageable surface of a digital imaging member.

When referring to any numerical range of values herein, such ranges are understood to include each and every number and/or fraction between the stated range minimum and maximum. For example, a range of 0.5-6% would expressly include the endpoints 0.5% and 6%, plus all intermediate values of 0.6%, 0.7%, and 0.9%, all the way up to and including 5.95%, 5.97%, and 5.99%. The same applies to each other numerical property and/or elemental range set forth herein, unless the context clearly dictates otherwise.

The modifier "about" used in connection with a quantity is inclusive of the stated value and has the meaning dictated by the context (for example, it includes at least the degree of error associated with the measurement of the particular quantity). When used with a specific value, it should also be considered as disclosing that value. For example, the term "about 2" also discloses the value "2" and the range "from about 2 to about 4" also discloses the range "from 2 to 4."

The term "controller" is used herein generally to describe various apparatus such as a computing device relating to the operation of one or more device that directs or regulates a process or machine. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

The terms "media", "print media", "print substrate" and "print sheet" generally refers to a usually flexible physical sheet of paper, polymer, Mylar material, plastic, or other suitable physical print media substrate, sheets, webs, etc., for images, whether precut or web fed. The listed terms "media", "print media", "print substrate" and "print sheet" may also include woven fabrics, non-woven fabrics, metal films, and foils, as readily understood by a skilled artisan.

The term "image forming device", "printing device" or "printing system" as used herein may refer to a digital copier or printer, scanner, image printing machine, xerographic device, electrostatographic device, digital production press, document processing system, image reproduction machine, bookmaking machine, facsimile machine, multi-function machine, or generally an apparatus useful in performing a print process or the like and can include several marking engines, feed mechanism, scanning assembly as well as other print media processing units, such as paper feeders, finishers, and the like. A "printing system" may handle sheets, webs, substrates, and the like. A printing system can place marks on any surface, and the like, and is any machine that reads marks on input sheets; or any combination of such machines.

The term "fountain solution" or "dampening fluid" refers to dampening fluid that may coat or cover a surface of a structure (e.g., imaging member, transfer roll) of an image forming device to affect connection of a marking material (e.g., ink, toner, pigmented or dyed particles or fluid) to the surface. The fountain solution may include water optionally with small amounts of additives (e.g., isopropyl alcohol, ethanol) added to reduce surface tension as well as to lower evaporation energy necessary to support subsequent laser patterning. Low surface energy solvents, for example volatile silicone oils, can also serve as fountain solutions. Fountain solutions may also include wetting surfactants, such as silicone glycol copolymers. The fountain solution may include D4 or D5 dampening fluid alone, mixed, and/or with wetting agents. The fountain solution may also include Isopar G, Isopar H, Dowsil OS20, Dowsil OS30, and mixtures thereof.

As used herein, the terms "anemometer" or "anemometric" refer to systems and methods for measuring air flow and changes in temperature of an anemometer wire element as air flows past it. Typically, hot wire anemometers use a very fine wire (on the order of several micrometers) electrically heated to some temperature above ambient air temperature. Air flowing past the wire cools the wire. As the electrical resistance of most metals is dependent upon the temperature of the metal (tungsten is a popular choice for hot-wires), a relationship can be obtained between the resistance of the wire and the air flow speed. Several ways of implementing this exist, and hot-wire devices can be further classified as CCA (constant current anemometer), CVA (constant voltage anemometer), and/or CTA (constant-temperature anemometer). The voltage output from these anemometers is thus the result of some sort of circuit within the device trying to maintain the specific variable (current, voltage, or temperature) constant, following Ohm's law (V=IR).

Inking systems or devices may be incorporated into a digital offset image forming device architecture so that the inking system is arranged about a central imaging plate, also referred to as an imaging member. In such a system, the imaging member, including a central drum or cylinder is provided with a reimageable layer. This blanket layer has specific properties such as composition, surface profile, and so on so as to be well suited for receipt and carrying a layer of a fountain solution. A surface of the imaging member is reimageable making the imaging member a digital imaging member. The surface is constructed of elastomeric materials and conformable. A paper path architecture may be situated adjacent the imaging member to form a media transfer nip.

A layer of fountain solution may be applied to the surface of the imaging member by a dampening system. In a digital evaporation step, particular portions of the fountain solution layer applied to the surface of the imaging member may be evaporated by a digital evaporation system. For example, portions of the fountain solution layer may be vaporized by an optical patterning subsystem such as a scanned, modulated laser that patterns the fluid solution layer to form a latent image. In a vapor removal step, the vaporized fountain solution may be collected by a vapor removal device or vacuum to prevent condensation of the vaporized fountain solution back onto the imaging plate.

In an inking step, ink may be transferred from an inking system to the surface of the imaging member such that the ink selectively resides in evaporated voids formed by the patterning subsystem in the fountain solution layer to form an inked image. In an image transfer step, the inked image is then transferred to a print substrate such as paper via pressure at the media transfer nip.

In a variable lithographic printing process, previously imaged ink must be removed from the imaging member surface to prevent ghosting. After an image transfer step, the surface of the imaging member may be cleaned by a cleaning system so that the printing process may be repeated. For example, tacky cleaning rollers may be used to remove residual ink and fountain solution from the surface of the imaging member.

FIG. 1 depicts an exemplary ink-based digital image forming device 10. The image forming device 10 may include dampening station 12 having fountain solution applicator 14, optical patterning subsystem 16, inking apparatus 18, and a cleaning device 20. The image forming device 10 may also include one or more rheological conditioning subsystems 22 as discussed, for example, in greater detail below. FIG. 1 shows the fountain solution applicator 14 arranged with a digital imaging member 24 having a reimageable surface 26. While FIG. 1 shows components that are formed as rollers, other suitable forms and shapes may be implemented.

The imaging member surface 26 may be wear resistant and flexible. The surface 26 may be reimageable and conformable, having an elasticity and durometer, and sufficient flexibility for coating ink over a variety of different media types having different levels of roughness. A thickness of the reimageable surface layer may be, for example, about 0.5 millimeters to about 4 millimeters. The surface 26 should have a weak adhesion force to ink, yet good oleophilic wetting properties with the ink for promoting uniform inking of the reimageable surface and subsequent transfer lift of the ink onto a print substrate.

The soft, conformable surface 26 of the imaging member 24 may include, for example, hydrophobic polymers such as silicones, partially or fully fluorinated fluorosilicones and FKM fluoroelastomers. Other materials may be employed, including blends of polyurethanes, fluorocarbons, polymer catalysts, platinum catalyst, hydrosilyation catalyst, etc. The surface may be configured to conform to a print substrate on which an ink image is printed. To provide effective wetting of fountain solutions such as water-based dampening fluid, the silicone surface need not be hydrophilic, but may be hydrophobic. Wetting surfactants, such as silicone glycol copolymers, may be added to the fountain solution to allow the fountain solution to wet the reimageable surface 26. The imaging member 24 may include conformable reimageable surface 26 of a blanket or belt wrapped around a roll or drum. The imaging member surface 26 may be temperature controlled to aid in a printing operation. For example, the imaging member 24 may be cooled internally (e.g., with chilled fluid) or externally (e.g., via a blanket chiller roll 28 to a temperature (e.g., about 10° C.-60° C.) that may aid in the image forming, transfer and cleaning operations of image forming device 10.

The reimageable surface 26 or any of the underlying layers of the reimageable belt/blanket may incorporate a radiation sensitive filler material that can absorb laser energy or other highly directed energy in an efficient manner.

Examples of suitable radiation sensitive materials are, for example, microscopic (e.g., average particle size less than 10 micrometers) to nanometer sized (e.g., average particle size less than 1000 nanometers) carbon black particles, carbon black in the form of nano-particles of, single or multi-wall nanotubes, graphene, iron oxide nano particles, nickel plated nano particles, etc., added to the polymer in at least the near-surface region. It is also possible that no filler material is needed if the wavelength of a laser is chosen so to match an absorption peak of the molecules contained within the fountain solution or the molecular chemistry of the outer surface layer. As an example, a 2.94 µm wavelength laser would be readily absorbed due to the intrinsic absorption peak of water molecules at this wavelength.

The fountain solution applicator 14 may be configured to deposit a layer of fountain solution onto the imaging member surface 26 directly or via an intermediate member (e.g., roller 30) of the dampening station 12. While not being limited to particular configuration, the fountain solution applicator 14 may include a series of rollers or sprays (not shown) for uniformly wetting the reimageable surface 26 with a uniform layer of fountain solution with the thickness of the layer being controlled. The series of rollers may be considered as dampening rollers or a dampening unit, for uniformly wetting the reimageable surface 26 with a layer of fountain solution. The fountain solution may be applied by fluid or vapor deposition to create a thin layer (e.g., between about 0.01 µm and about 1.0 µm in thickness, less than 5 µm, about 50 nm to 100 nm) of the fountain solution for uniform wetting and pinning.

A sensor 32, for example an in-situ non-contact laser gloss sensor or laser contrast sensor, may be used to confirm the uniformity of the layer. Such a sensor can be used to automate the dampening station 12. While not being limited to a particular utility, the sensor 32 may provide feedback to control the deposition of the fountain solution onto reimageable surface 26.

The optical patterning subsystem 16 is located downstream the fountain solution applicator 14 in the printing processing direction to selectively pattern a latent image in the layer of fountain solution by image-wise patterning using, for example, laser energy. For example, the fountain solution layer is exposed to an energy source (e.g. a laser) that selectively applies energy to portions of the layer to image-wise evaporate the fountain solution and create a latent "negative" of the ink image that is desired to be printed on a receiving substrate 34. Image areas are created where ink is desired, and non-image areas are created where the fountain solution remains. While the optical patterning subsystem 16 is shown as including laser emitter 36, it should be understood that a variety of different systems may be used to deliver the optical energy to pattern the fountain solution layer.

Still referring to FIG. 1, a vapor vacuum 38 or air knife may be positioned downstream the optical patterning subsystem to collect vaporized fountain solution and thus avoid leakage of excess fountain solution into the environment. Reclaiming excess vapor prevents fountain solution from depositing uncontrollably prior to the inking apparatus 18 and imaging member 24 interface. The vapor vacuum 38 may also prevent fountain solution vapor from entering the environment. Reclaimed fountain solution vapor can be condensed, filtered and reused as understood by a skilled artisan to help minimize the overall use of fountain solution by the image forming device 10.

The internal environment sensor 132 is connected to a thickness module 390 at a data acquisition module or controller 60. The environment sensor 132 acquires data at image forming device 10 around the area where the fountain solution is being applied by dampening station 12. For example, a thermometer, a hygrometer, a barometer, a fluid gauge, an anemometer, or a length measurement of imaging blanket 24 may be used. An air velocity or air flow is measured by an anemometer. From the environment sensor 132 parameters of the flow with or without vaporized fountain solution can be obtained such as specific heat, density and enthalpy values. These values can then be used by controller 60 derive volume and thickness of the applied solution.

Following patterning of the fountain solution layer by the optical patterning subsystem 16, the patterned layer over the reimageable surface 26 is presented to the inking apparatus 18. The inker apparatus 18 is positioned downstream the optical patterning subsystem 16 to apply a uniform layer of ink over the layer of fountain solution and the reimageable surface layer 26 of the imaging member 24. The inking apparatus 18 may deposit the ink to the evaporated pattern representing the imaged portions of the reimageable surface 26, while ink deposited on the unformatted portions of the fountain solution will not adhere based on a hydrophobic and/or oleophobic nature of those portions. The inking apparatus may heat the ink before it is applied to the surface 26 to lower the viscosity of the ink for better spreading into imaged portion pockets of the reimageable surface. For example, one or more rollers 40 of the inking apparatus 18 may be heated, as well understood by a skilled artisan. Inking roller 40 is understood to have a structure for depositing marking material onto the reimageable surface layer 26, and may include an anilox roller or an ink nozzle. Excess ink may be metered from the inking roller 40 back to an ink container 42 of the inker apparatus 18 via a metering member 44 (e.g., doctor blade, air knife).

Although the marking material may be an ink, such as a UV-curable ink, the disclosed embodiments are not intended to be limited to such a construct. The ink may be a UV-curable ink or another ink that hardens when exposed to UV radiation. The ink may be another ink having a cohesive bond that increases, for example, by increasing its viscosity. For example, the ink may be a solvent ink or aqueous ink that thickens when cooled and thins when heated.

Downstream the inking apparatus 18 in the printing process direction resides ink image transfer station 46 that transfers the ink image from the imaging member surface 26 to a print substrate 34. The transfer occurs as the substrate 34 is passed through a transfer nip 48 between the imaging member 24 and an impression roller 50 such that the ink within the imaged portion pockets of the reimageable surface 26 is brought into physical contact with the substrate 34.

Rheological conditioning subsystems 22 may be used to increase the viscosity of the ink at specific locations of the digital offset image forming device 10 as desired. While not being limited to a particular theory, rheological conditioning subsystem 22 may include a curing mechanism 52, such as a UV curing lamp (e.g., standard laser, UV laser, high powered UV LED light source), wavelength tunable photoinitiator, or other UV source, that exposes the ink to an amount of UV light (e.g., # of photons radiation) to at least partially cure the ink/coating to a tacky or solid state. The curing mechanism may include various forms of optical or photo curing, thermal curing, electron beam curing, drying, or chemical curing. In the exemplary image forming device 10 depicted in FIG. 1, rheological conditioning subsystem 22 may be positioned adjacent the substrate 34 downstream the ink image transfer station 46 to cure the ink image transferred to the substrate. Rheological conditioning subsystems 22 may also be positioned adjacent the imaging member surface 26 between the ink image transfer station 46 and cleaning device 20 as a preconditioner to harden any residual ink 54 for easier removal from the imaging member surface 26 that prepares the surface to repeat the digital image forming operation.

This residual ink removal is most preferably undertaken without scraping or wearing the imageable surface of the imaging member. Removal of such remaining fluid residue may be accomplished through use of some form of cleaning device 20 adjacent the surface 26 between the ink image transfer station 46 and the fountain solution applicator 14. Such a cleaning device 20 may include at least a first cleaning member 56 such as a sticky or tacky roller in physical contact with the imaging member surface 26, with the sticky or tacky roller removing residual fluid materials (e.g., ink, fountain solution) from the surface. The sticky or tacky roller may then be brought into contact with a smooth roller (not shown) to which the residual fluids may be transferred from the sticky or tacky member, the fluids being subsequently stripped from the smooth roller by, for example, a doctor blade or other like device and collected as waste. It is understood that the cleaning device 20 is one of numerous types of cleaning devices and that other cleaning devices designed to remove residual ink/fountain solution from the surface of imaging member 24 are considered within the scope of the embodiments. For example, the cleaning device could include at least one roller, brush, web, belt, tacky roller, buffing wheel, etc., as well understood by a skilled artisan.

In the image forming device 10, functions and utility provided by the dampening station 12, optical patterning subsystem 16, inking apparatus 18, cleaning device 20, rheological conditioning subsystems 22, imaging member 24 and sensor 32 may be controlled, at least in part by controller 60. Such a controller 60 is shown in FIG. 1 and may be further designed to receive information and instructions from a workstation or other image input devices (e.g., computers, smart phones, laptops, tablets, kiosk) to coordinate the image formation on the print substrate through the various subsystems such as the dampening station 12, patterning subsystem 16, inking apparatus 18, imaging member 24 and sensor 32 as discussed in greater detail below and understood by a skilled artisan.

Figure 2:
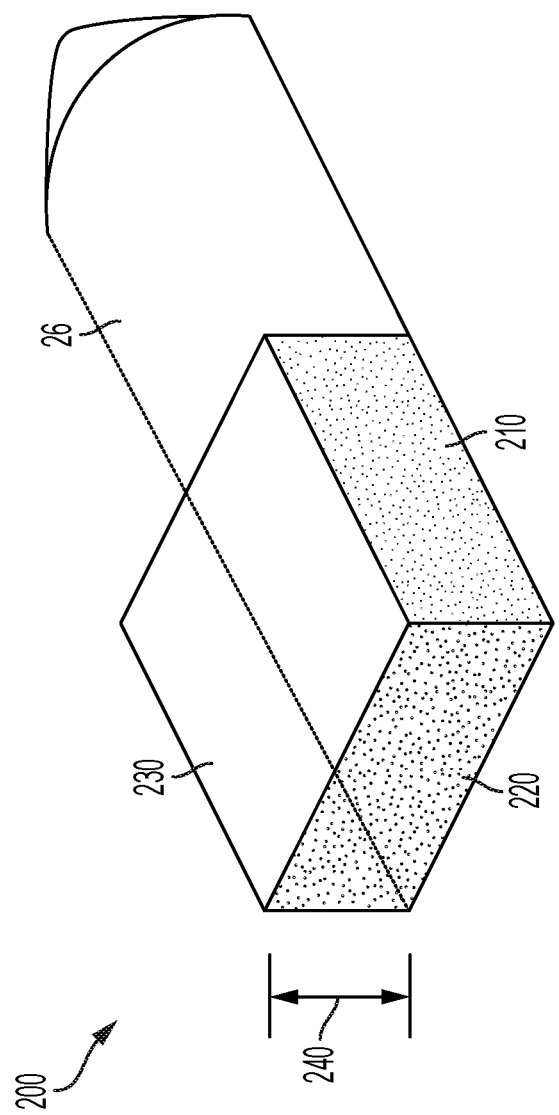
FIG. 2 is a pictorial representation of fountain solution on an imaging blanket to determine thickness in accordance to an embodiment.
Figure 3:
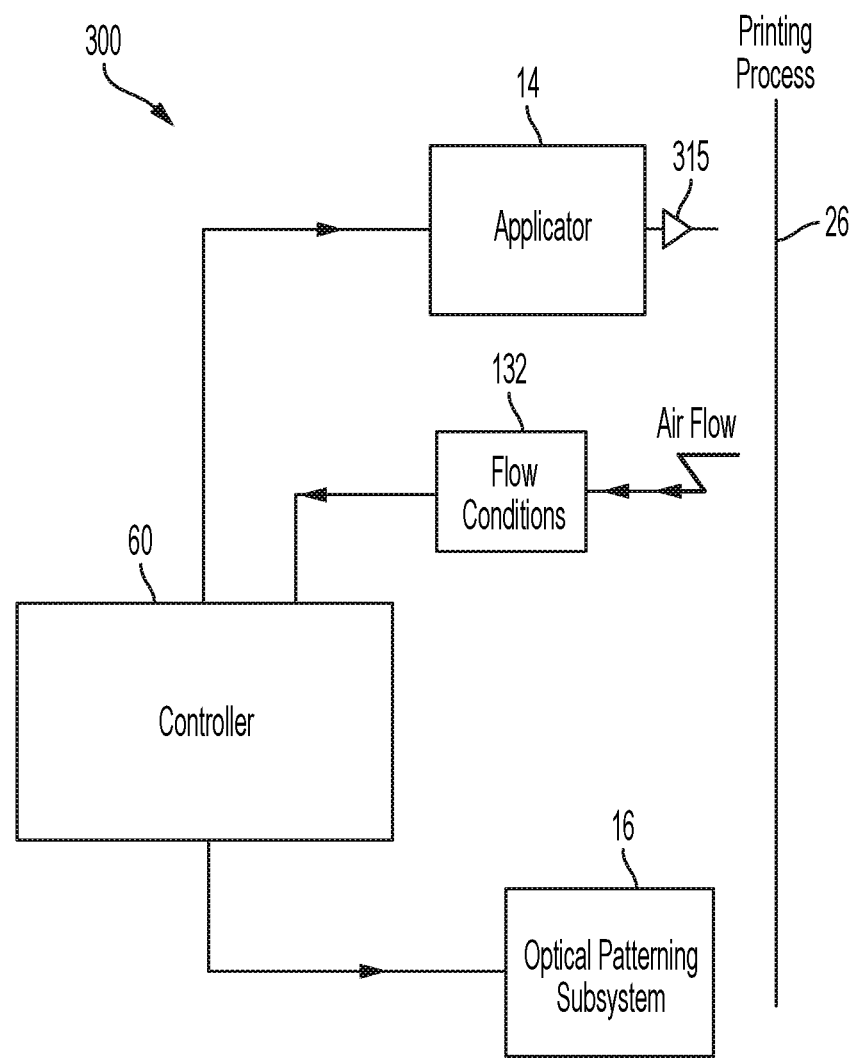
FIG. 3 is part of a digital image forming device that includes a feedback loop for controlling and applicator that dispenses fountain solution in accordance to an embodiment.
Figure 4:
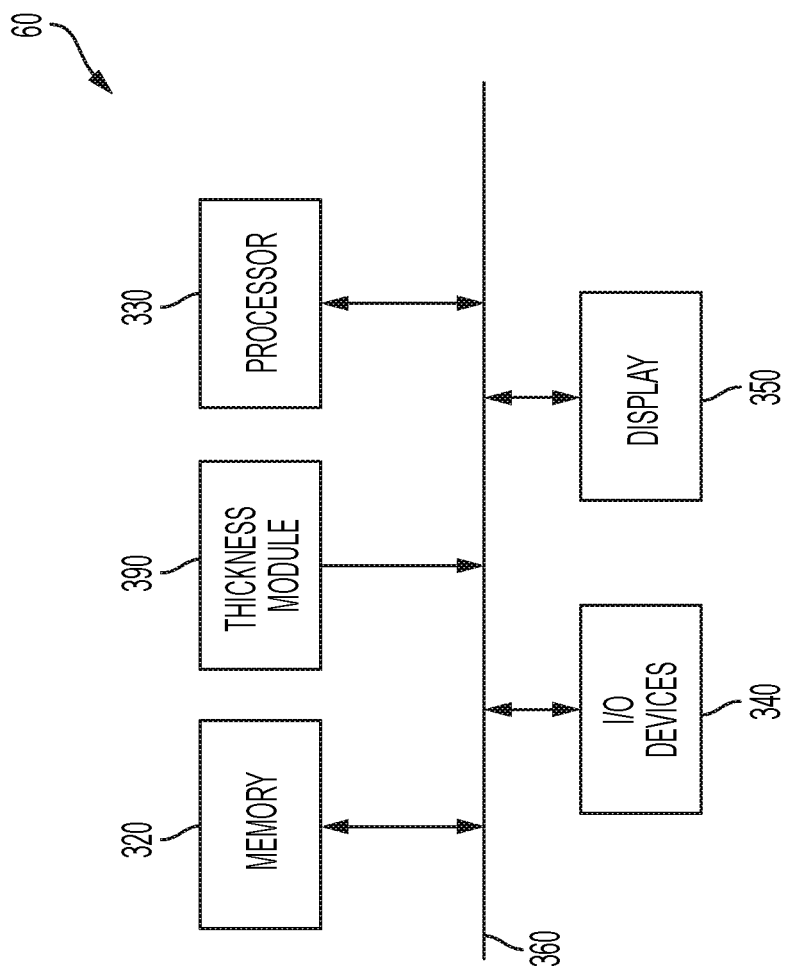
FIG. 4 is a block diagram of a controller with a processor for executing instructions to automatically control devices in the digital image forming device depicted in FIGS. 1 and 3 in accordance to an embodiment.

FIG. 2 through FIG. 4 show different aspects for measuring fountain solution thickness. Concerning these figures the portions which are the same as those in a prior described embodiment such as in FIG. 1 are denoted by the same reference numerals, and descriptions of the same portions as those as in a prior embodiment will be omitted.

FIG. 2 is a pictorial representation of fountain solution on an imaging blanket to determine thickness in accordance to an embodiment. The pictorial representation 200 shows a volume 230 of fountain solution on the surface 26 of imaging blanket 24. The volume 230 of fountain solution has been placed in a defined coverage area commonly referred to as the defined imaging area. The defined imaging area has a specific width (cross-blanket dimension) 220 and length (down-blanket dimension) 210. In some cases the width 220 of the imaging area may be approximately equal to the width of imaging blanket 24, and the length of the imaging area may be a function of the curvature of the imaging blanket 24 at the imaging location. The area occupied by the fountain solution 230 is defined by the product of the width 220 and the length 210. The volume 230 of the fountain solution is defined by the area (210 & 220) and the height 240 which is the same as the fountain solution thickness. Using an anemometer in combination with energy and heat balance equations the volumetric flow of the vaporized solution can be determine.

FIG. 3 is part of a digital image forming device that includes a feedback loop for controlling and applicator that dispenses fountain solution in accordance to an embodiment. To control the different subsystems a baseline air flow measurement are collected without vaporizing (baseline) and during vaporizing (operational) of the fountain solution. The vaporized measurement is correlated with the baseline utilizing specific heat, density and enthalpy values and keeping velocity of fluid constant. The volume of the vaporized fountain solution is determined and used with the known image area to determine thickness.

Apparatus 300 comprises an applicator for dispensing fountain solution through valve actuator 315, a flow conditions module 132 such as an anemometer, an optical patterning subsystem comprising a laser source and a controller 60. In operation, fountain solution thickness is determined using controller 60 and flow conditions module 132 and the controller uses the determination to increase or decrease the energy output of optical patterning subsystem 16. In the alternative or concurrently controller 60 produces actionable information such as control values that can be used by the dampening solution subsystem such as fountain solution applicator 14 to increase or decrease the fountain solution applied to imaging blanket 24 or digital imaging member.

The fluid pathway, in this embodiment includes a flow condition sensor 132 like anemometer which is in line with the air fluid pathway and measures the air flow. This embodiment may include a pressure tap, which is configured to sense the pressure of the gas in the fluid path way. The pressure tap and anemometer 132 work in conjunction to communicate with the control system 60 in order to detect when corrective action may need to be taken such as changing laser output or changing solution output. However, it should be appreciated that flow may be measured in a variety of different ways. Other methods include a vane meter sensor also referred to as a VAF (volume air flow) sensor, hot wire system and/or a strain gauge type. However, in this embodiment the hot wire anemometer 132 which is a well-known thermal anemometer may measure the fluid velocity by noting the heat convected away by the fluid. The anemometer 132 measures the change in wire temperature under constant current by use of the convective theory.

FIG. 4 is a block diagram of a controller with a processor for executing instructions to automatically control devices in the digital image forming device depicted in FIGS. 1 and 3 in accordance to an embodiment.

The controller 60 may be embodied within devices such as a desktop computer, a laptop computer, a handheld computer, an embedded processor, a handheld communication device, or another type of computing device, or the like. The controller 60 may include a memory 320, a processor 330, input/output devices 340, a display 330 and a bus 360. The bus 360 may permit communication and transfer of signals among the components of the computing device 60.

Processor 330 may include at least one conventional processor or microprocessor that interprets and executes instructions. The processor 330 may be a general purpose processor or a special purpose integrated circuit, such as an ASIC, and may include more than one processor section. Additionally, the controller 60 may include a plurality of processors 330.

Memory 320 may be a random access memory (RAM) or another type of dynamic storage device that stores information and instructions for execution by processor 330. Memory 320 may also include a read-only memory (ROM) which may include a conventional ROM device or another type of static storage device that stores static information and instructions for processor 330. The memory 320 may be any memory device that stores data for use by controller 60. Memory 320 maintains air flow measurement data such as base line measurement and a multidimensional lookup table (LUT) of control values such as values correlating the fountain solution thickness or instructions for calculating FS thickness using anemometer data such as specific heat, density and enthalpy values. These LUT values can be used to print a diagnostic print or to make adjustment to the fountain solution to optimized control values for printing such as adjustment of the optical patterning subsystem 16.

Input/output devices 340 (I/O devices) may include one or more conventional input mechanisms that permit a user to input information to the controller 60, such as a microphone, touchpad, keypad, keyboard, mouse, pen, stylus, voice recognition device, buttons, and the like, and output mechanisms such as one or more conventional mechanisms that output information to the user, including a display, one or more speakers, a storage medium, such as a memory, magnetic or optical disk, disk drive, a printer device, and the like, and/or interfaces for the above. The display 330 may typically be an LCD or CRT display as used on many conventional computing devices, or any other type of display device.

The controller 60 may perform functions in response to processor 330 by executing sequences of instructions or instruction sets contained in a computer-readable medium, such as, for example, memory 320. Such instructions may be read into memory 320 from another computer-readable medium, such as a storage device, or from a separate device via a communication interface, or may be downloaded from an external source such as the Internet. The controller 60 may be a stand-alone controller, such as a personal computer, or may be connected to a network such as an intranet, the Internet, and the like. Other elements may be included with the controller 60 as needed.

The memory 320 may store instructions that may be executed by the processor to perform various functions. For example, the memory may store instructions to control the application of fountain solution, algorithms for calculating volume, image areas, density, and fountain thickness and instructions for controlling the current applied to the laser so as to adjust the optical power for patterning the fountain solution on the digital imaging member 24, and other control functions enumerated herewith.

The thickness module 390 may include instructions for determining fountain solution thickness from air flow data at various aspects of the print process such as baseline and operational flows. Changes in the measurement will then be related to the specific heat, density and enthalpy; the basis for which can be found in the attached well known equations:

$$Nu = 0.42Pr^{0.2} + 0.57Pr^{0.35} + Re^{0.50} \quad (5)$$

Where,

-continued $$Nu = \frac{hd}{k} \quad (Nusselt \text{ number})$$

$$Pr = \frac{mC_p}{k} \quad (Prandtl \text{ number})$$

$$Re = \frac{rUd}{m} \quad (Reynolds \text{ number})$$

and where, h = convective heat transfer coefficient d = characteristic length (wire diameter in this case)

k = fluid thermal conductivity $\mu$ = dynamic viscosity of the gas $\rho$ = gas density Cp = specific heat of the gas at constant pressure U = velocity of the flow Density can be back calculated to yield volume and knowing the area of the image being printed give a real time thickness value like noted in FIG. 2.

FIG. 5 is a flowchart depicting the operation of an exemplary process or method 500 to directly measure fountain solution for use in a digital image forming device. Method 500 may be invoked by the system 10 at any point of the printing process to allow closed loop control of the deposited fountain solution volume or it may be invoked during an off printing sequence to validate or set initial control values for fountain solution application or laser values for optical patterning of a desired image.

Action 510 takes base line measurement of air flow; action 515 stores base line measurement of air flow; action 520 take vaporized measurement of air flow; action 530 determine fountain solution thickness from vaporized measurement and stored baseline measurement; action 540 compare determined fountain solution thickness to determine if it is within limits to a determined value; If the determination is "NO" then process 500 initiate control of subsystems such as the optical patterning subsystem 16 or the applicator subsystem 12. If the determination is "YES" then the process is returned to the starting point.

The exemplary depicted sequence of executable method steps represents one example of a corresponding sequence of acts for implementing the functions described in the steps. The exemplary depicted steps may be executed in any reasonable order to carry into effect the objectives of the disclosed embodiments. No particular order to the disclosed steps of the method is necessarily implied by the depiction in FIG. 5, and the accompanying description, except where any particular method step is reasonably considered to be a necessary precondition to execution of any other method step. Individual method steps may be carried out in sequence or in parallel in simultaneous or near simultaneous timing. Additionally, not all of the depicted and described method steps need to be included in any particular scheme according to disclosure.

Those skilled in the art will appreciate that other embodiments of the disclosed subject matter may be practiced with many types of image forming elements common to offset inking system in many different configurations. For example, although digital lithographic systems and methods are shown in the discussed embodiments, the examples may apply to analog image forming systems and methods, including analog offset inking systems and methods. It should be understood that these are non-limiting examples of the variations that may be undertaken according to the disclosed schemes. In other words, no particular limiting configuration is to be implied from the above description and the accompanying drawings.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art.

What is claimed is:

1. A method useful in printing with a variable data lithography system, comprising:
   using a dampening station configured to provide fountain solution in an airborne state to a reimageable surface;
   performing an assessment check, including taking a base line measurement of air flow, and storing said base line measurement in a memory;
   taking an operational measurement of the air flow with a flow measurement device during application of the fountain solution in an airborne state to the reimageable surface;
   determining fountain solution thickness at the reimageable surface from a difference between the operational measurement and the base line measurement.

2. The method according to claim 1, wherein said flow measurement device is a thermal anemometer.

3. The method according to claim 2, wherein said thermal anemometer is a hot-wire anemometer.

4. The method according to claim 3, wherein the applied fountain solution in an airborne state forms a fixed image area on the reimageable surface.

5. The method according to claim 4, the method further comprising:
   determining density of the air flow during the baseline measurement and the operational measurement.

6. The method according to claim 4, the method further comprising:
   determining a change in density due to the application of the fountain solution in an airborne state on the reimageable surface.

7. The method according to claim 6, the method further comprising:
   determining volume of the applied fountain solution on the reimageable surface from the change in density.

8. The method according to claim 6, the method further comprising:
   determining fountain solution thickness of the applied fountain solution from the determined volume and the fixed image area.

9. The method in accordance to claim 8, the method further comprising:
   controlling an optical patterning subsystem based on the determined fountain solution thickness of the applied fountain solution.

10. The method in accordance to claim 8, the method further comprising:
    controlling a fountain solution deposition process at the dampening station based on the determined fountain solution thickness.

11. An apparatus useful in printing with a variable data lithographic system having a reimageable surface, comprising:
    a flow control structure that confines airborne fountain solution provided from a flow conduit to a condensation region to support forming a fountain solution layer at the reimageable surface;
    an optical patterning subsystem being configured to irradiate the fountain solution layer according to digital image data;
    a flow measurement device in line with said flow control structure which measures air flow around the reimageable surface;
    a processor; and
    a storage device coupled to the processor, wherein the storage device comprises instructions which, when executed by the processor, cause the processor to control optical patterning subsystem based fountain solution layer thickness by:
    performing an assessment check, including taking a base line measurement of the air flow, and storing said base line measurement in a memory;
    taking an operational measurement of the air flow with the flow measurement device during application of the fountain solution in an airborne state to the reimageable surface;
    determining fountain solution thickness at the reimageable surface from a difference between the operational measurement and the base line measurement.

12. The apparatus according to claim 11, wherein said flow measurement device is a thermal anemometer.

13. The apparatus according to claim 12, wherein said thermal anemometer is a hot-wire anemometer.

14. The apparatus according to claim 13, wherein the applied fountain solution in an airborne state forms a fixed image area on the reimageable surface.

15. The apparatus according to claim 14, the apparatus further comprising:
    determining density of the air flow during the baseline measurement and the operational measurement.

16. The apparatus according to claim 14, the processor further performing:
    determining a change in density due to the application of the fountain solution in an airborne state on the reimageable surface.

17. The apparatus according to claim 16, the processor further performing:
    determining volume of the applied fountain solution on the reimageable surface from the change in density.

18. The apparatus according to claim 16, the processor further performing:
    determining fountain solution thickness of the applied fountain solution from the determined volume and the fixed image area.

19. The apparatus in accordance to claim 18, the apparatus further comprising:
    controlling the optical patterning subsystem based on the determined fountain solution thickness of the applied fountain solution.

20. The apparatus in accordance to claim 18, the apparatus further comprising:
    controlling a fountain solution deposition process at the flow control structure based on the determined fountain solution thickness.

* * * * *